United States Patent
Braun

(10) Patent No.: US 9,595,952 B2
(45) Date of Patent: Mar. 14, 2017

(54) SWITCHING CIRCUIT AND THE METHOD THEREOF

(71) Applicant: Monolithic Power Systems, Inc., San Jose, CA (US)

(72) Inventor: Eric Braun, Mountain View, CA (US)

(73) Assignee: MONOLITHIC POWER SYSTEMS, INC., San Jose, CA (US)

( * ) Notice: Subject to any disclaimer, the term of this patent is extended or adjusted under 35 U.S.C. 154(b) by 189 days.

(21) Appl. No.: 14/106,421

(22) Filed: Dec. 13, 2013

(65) Prior Publication Data

US 2015/0171855 A1    Jun. 18, 2015

(51) Int. Cl.
*H03K 17/16*        (2006.01)
*H03K 17/284*    (2006.01)
*H03K 17/567*    (2006.01)

(52) U.S. Cl.
CPC ......... *H03K 17/162* (2013.01); *H03K 17/284* (2013.01); *H03K 17/567* (2013.01); *H03K 2217/0036* (2013.01); *H03K 2217/0063* (2013.01); *H03K 2217/0072* (2013.01)

(58) Field of Classification Search
CPC ... H03K 17/162; H03K 17/284; H03K 17/567

USPC ......................................................... 327/109
See application file for complete search history.

(56) References Cited

U.S. PATENT DOCUMENTS

| | | | |
|---|---|---|---|
| 6,107,844 A * | 8/2000 | Berg | H02M 7/5387 327/110 |
| 6,897,643 B2 | 5/2005 | Stone | |
| 7,382,116 B2 * | 6/2008 | Endo | G05F 1/618 323/223 |
| 7,489,166 B2 * | 2/2009 | Honda | H03K 17/166 326/82 |
| 7,940,092 B2 * | 5/2011 | Zheng | H03K 17/08122 327/110 |
| 2006/0087300 A1 * | 4/2006 | Endo | G05F 1/618 323/282 |
| 2007/0025123 A1 | 2/2007 | Kim | |

* cited by examiner

*Primary Examiner* — Ryan Jager

(57) ABSTRACT

A switching circuit having a low side driver providing a three-level low side drive signal keeps a low side power switch slightly on during a dead time between the low side power switch turn off and a high side power switch turn on, thus a current flowing through a body diode is mostly distributed to the slightly on low side power switch instead of the body diode.

7 Claims, 8 Drawing Sheets

SWITCHING CIRCUIT AND THE METHOD THEREOF

TECHNICAL FIELD

The present invention relates to electrical circuits, more specifically, the present invention relates to switching converters.

BACKGROUND

In a switching circuit comprising a high side power switch and a low side power switch coupled in series to be on and off alternatively so as to provide power to a load of the switching circuit, there will be a dead time between the low side power switch turn off and the high side power switch turn on to avoid a large current leakage from a power source of the switching circuit to ground, which means that the high side power switch and the low side power switch are both off during the dead time. Unfortunately, a body diode of the low side power switch stores charges during the dead time which leads to additional power loss, switching overshoot and ringing.

SUMMARY

It is an object of the present invention to provide a switching circuit with a low side driver providing a 3-level low side driving signal to keep the low side power switch slightly on during the dead time so as to avoid the large current flowing through the body diode and associated large charges stored in the body diode, which mitigates the above problems.

In accomplishing the above objective, there has been provided, in accordance with an embodiment of the present invention, a switching circuit, comprising: a high side power switch having a first terminal coupled to an input voltage of the switching circuit, a second terminal coupled to a switching node, and a control terminal configured to receive a high side driving signal; a low side power switch having a first terminal coupled to the switching node, a second terminal coupled to a reference ground, and a control terminal configured to receive a low side driving signal; and a low side driver having a first input terminal coupled to the switching node to receive a switching signal, a second input terminal configured to receive a switching control signal, and an output terminal configured to provide the low side driving signal based on the switching signal and the switching control signal; wherein the high side power switch and the low side power switch are turned on and off alternatively, and the low side driving signal has a middle drive value between a power voltage of the low side driver and the reference ground during a dead time between the low side power switch turn off and the high side power switch turn on, to slightly turn on the low side power switch.

Furthermore, there has been provided, in accordance with an embodiment of the present invention, a method for driving a switching circuit, wherein the switching circuit comprises a high side power switch and a low side power switch with a body diode, the method comprising: turning on and off the high side power switch and the low side power switch alternatively to convert an input voltage to an output voltage; inserting a dead time between the low side power switch turn off and the high side power switch turn on; keeping the high side power switch off and the low side power switch slightly on during the dead time; and turning on the high side power switch and turning off the low side power switch after the dead time.

The use of the similar reference label in different drawings indicates the same of like components.

DETAILED DESCRIPTION

Embodiments of circuits/structures for switching circuit are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
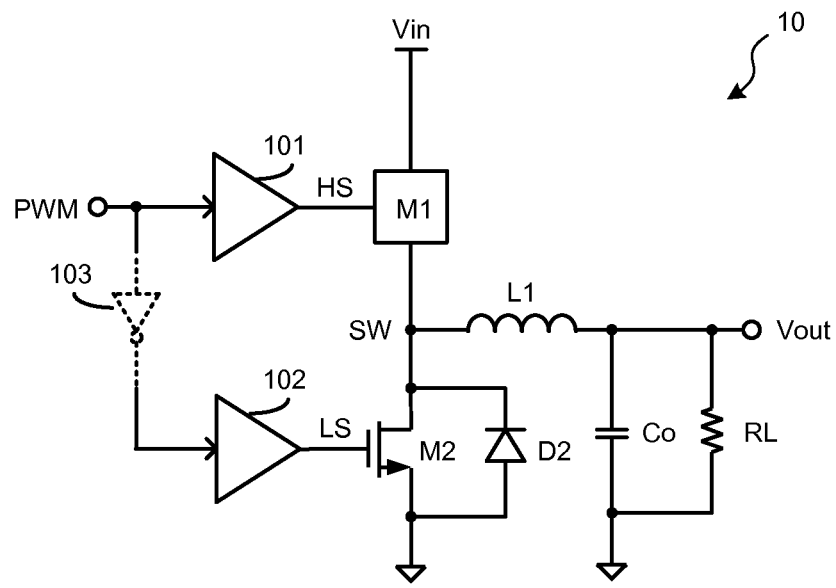
FIG. 1 schematically shows a prior art switching circuit 10.

FIG. 1 schematically shows a prior art switching circuit 10. The switching circuit 10 comprises a high side power switch M1 and a low side power switch M2 coupled in series. The high side power switch M1 and the low side power switch M2 are turned on and off alternatively by a high side driving signal HS and a low side driving signal LS to convert an input voltage Vin to an output voltage Vout. A switching control signal PWM is provided to a high side driver 101 and a low side driver 102 to generate the high side driving signal HS and the low side driving signal LS. The high side driving signal HS and the low side driving signal LS may have same phase if one of the high side power switch M1 and the low side power switch M2 is a P-type transistor and the other one is a N-type transistor. Also, the high side driving signal HS and the low side driving signal LS may have opposite phase with an inverter 103 if both the high power switch M1 and the low side power switch M2 are N-type transistors or P-type transistors.

The switching circuit 10 further includes an output inductor L1 and an output capacitor Co. The load of the switching circuit 10 is represented by a resistor RL coupled across the output capacitor Co. When the high side power switch M1 is on and the low side power switch M2 is off, a current flowing through the output inductor L1 increases to charge the output capacitor Co so as to develop the output voltage Vout; when the high side power switch M1 is off and the low side power switch M2 is on, the current flowing through output inductor L1 decreases, and the output capacitor Co supplies power to the load RL to maintain the output voltage Vout.

Figure 2:
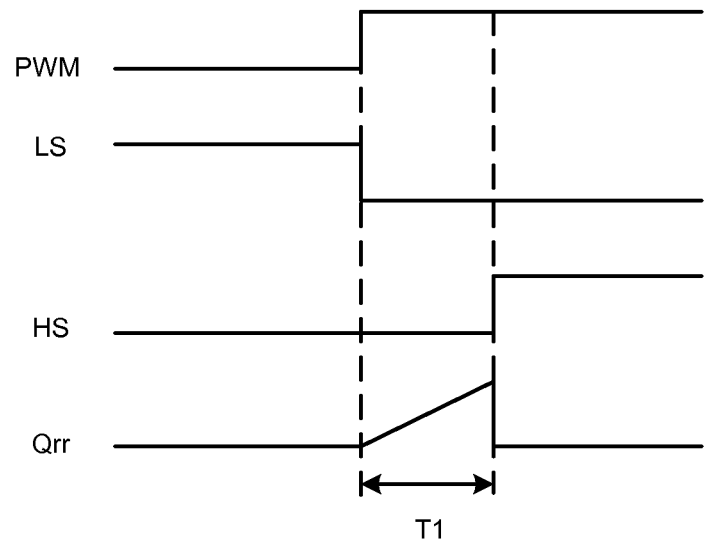
FIG. 2 shows waveforms of signals in the switching circuit 10 in FIG. 1.

FIG. 2 shows waveforms of signals in the switching circuit 10 in FIG. 1. Suppose that the high side power switch M1 and the low side power switch M2 are both N-type MOSFETs. As can be seen from FIG. 2, the low side driving signal LS is logical high and the high side driving signal is logical low before a dead time T1, which means that the low side power switch M2 is on and the high side power switch M1 is off then. During the dead time T1, the low side driving signal LS and the high side driving signal HS are both logical low, so the low side power switch M2 and the high side power switch M1 are both off. After the dead time T1, the low side driving signal LS is logical low and the high side driving signal HS is logical high. As a result, the high side power switch M1 is on and the low side power switch M2 is off. So the dead time T1 is between the high side power switch M1 turn on and the low side power switch M2 turn off. As known by persons with ordinary skill in the art that the low side power switch M2 has a body diode D2 coupled in parallel to the low side power switch M2 as shown in FIG. 1. The body diode D2 is a parasitic component and will be conducted during the dead time T1. Thus, a current will flow through the body diode D2 from the ground reference to the output inductor L1 during the dead time T1. This current leaves charges Qrr stored in the body diode D2 which leads to a power loss f*Qrr*Vin when the high side power switch M1 is turned on, wherein f is the frequency of the switching circuit. Furthermore, the stored charge Qrr may also result in increased overshoot and ringing during the low to high transition at the SW node, wherein the amplitudes of the overshot and the ringing are dependent on switching speed and parasitic inductance.

Figure 3:
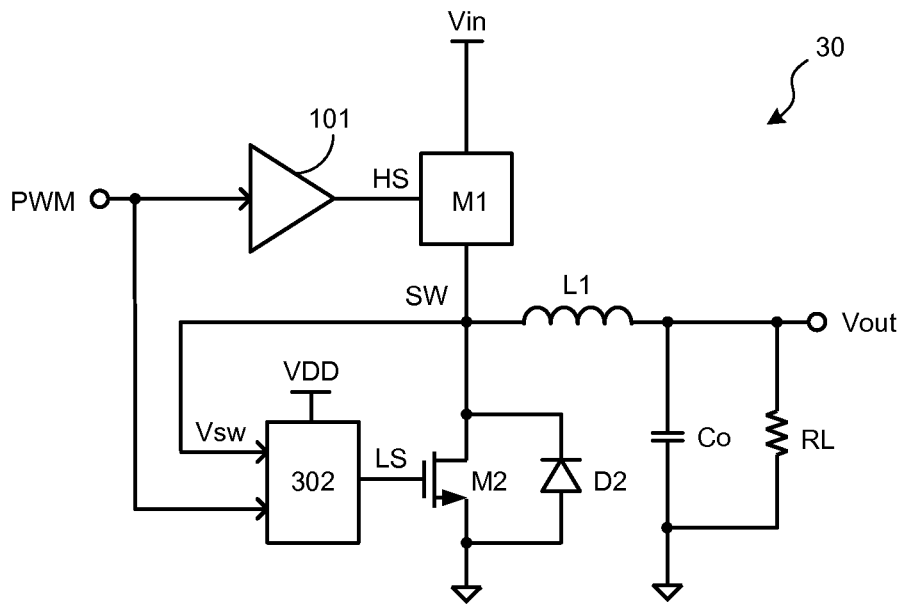
FIG. 3 schematically shows a switching circuit 30 in accordance with an embodiment of the present invention.

To save power loss so as to improve the efficiency of the switching circuit, and also to reduce overshoot and ringing to improve the robustness margin and EMI (Electro-Magnetic Interference) of the switching circuit, an improved switching circuit in accordance with an embodiment of the present invention is provided. FIG. 3 schematically shows a switching circuit 30 in accordance with an embodiment of the present invention. The switching circuit 30 comprises: a high side power switch M1 having a first terminal coupled to an input voltage Vin of the switching circuit 30, a second terminal coupled to a switching node SW, and a control terminal configured to receive a high side driving signal HS; a low side power switch M2 having a first terminal coupled to the switching node SW, a second terminal coupled to a reference ground, and a control terminal configured to receive a low side driving signal LS; and a low side driver 302 having a first input terminal coupled to the switching node SW to receive a switching signal Vsw, a second input terminal configured to receive a switching control signal PWM, and an output terminal configured to provide the low side driving signal LS based on the switching signal Vsw and the switching control signal PWM; wherein the high side power switch M1 and the low side power switch M2 are turned on and off alternatively, and the low side driving signal LS has a middle drive value between a power voltage VDD of the low side driver 302 and the reference ground during the dead time T1 between the low side power switch M2 turn off and the high side power switch M1 turn on, to slightly turn on the low side power switch M2.

In one embodiment, the high side power switch M1 and the low side power switch M2 may comprise MOSFET. In the example of FIG. 3, the low side power switch comprises an N-type MOSFET with the body diode D2 coupled in parallel. Persons of ordinary skill in the art should know that the low side power switch M2 may comprise P-type MOSFET too.

Persons of ordinary skill in the art should know that the low side drive signal LS may be powered by a power circuit (not shown) so as to effectively control the low side power switch M2.

The middle drive value is chosen according to the application. In one embodiment, the middle drive value is lower than an internal threshold of the low side power switch M2 and is a few hundreds mV. The "slight on" low side power switch M2 during the dead time is only to distribute current flowing through the body diode D2 during the dead time between the low side power switch turn off and the high side power switch turn on. In one embodiment, the higher the middle drive value, the more current is distributed to the low side power switch M2. But if the middle drive value is too high, and the low side power switch M2 operates too far above the internal threshold voltage of the low side power switch M2, it is hard to turn the low side power switch M2 off fast enough to avoid shoot through during low to high transition at the switching node SW. So the middle drive value has a tradeoff between the fast turn off and the capability of distributing current from the body diode D2. Meanwhile, the low side power switch M2 in a different system may have different performance. So the useful/optimal range of the middle drive value depends on the specifications of the MOSFET adopted as the low side power switch M2 and also depends on the power circuit configured to power the low side drive signal LS.

In one embodiment, the switching circuit 30 further comprises a high side driver 101 having an input terminal coupled to the switching control signal PWM and an output terminal configured to provide the high side driving signal HS based on the switching control signal PWM. As known by persons of ordinary skill in the art, the dead time T1 may be inserted by adding a delay time to the high side driver 101 or by other common ways.

In one embodiment, the switching signal Vsw is equal to the input voltage Vin when the high side power switch M1 is ON, and is equal to the ground reference when the low side power switch M2 is ON.

The power voltage VDD is the power supply to the low side driver 302 and the high side driver 101. In one embodiment, a high level of the logical signal, e.g. the switching control signal PWM, has a magnitude equal to the value of the power voltage VDD. The low side drive signal LS has three levels, i.e. the high level (VDD), the middle level (middle drive value) and the low level (ground reference).

The switching circuit 30 includes the output inductor L1 and the output capacitor Co. The load is represented by the resistor RL coupled across the output capacitor Co. When the high side power switch M1 is ON and the low side power switch M2 is OFF, the current flowing through the output inductor L1 increases to charge the output capacitor Co so as to develop the output voltage Vout; when the high side power switch M1 is OFF and the low side power switch M2 is ON, the current flowing through output inductor L1 decreases, and the output capacitor Co supplies power to the load RL to maintain the output voltage Vout.

Figure 4:
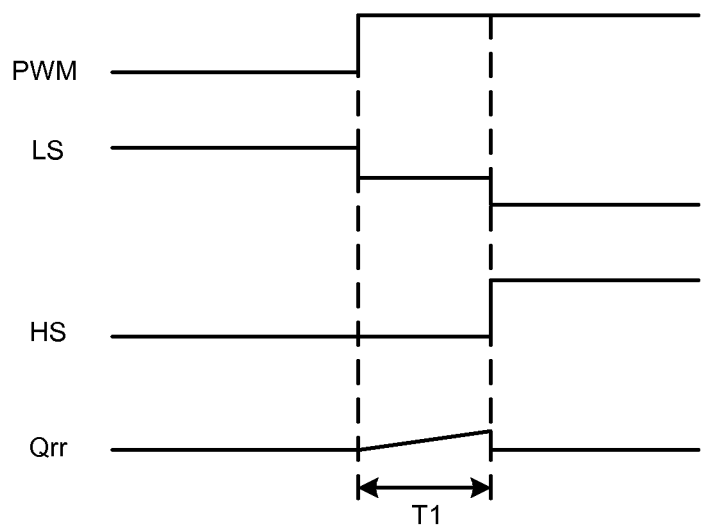
FIG. 4 shows waveforms of signals in switching circuit 30.

FIG. 4 shows waveforms of signals in switching circuit 30. In the example of FIG. 4, the high side power switch M1 in FIG. 3 is supposed to comprise an N-type MOSFET. The high side driving signal HS has an opposite phase to the low side driving signal LS, as shown in FIG. 4. Persons of ordinary skill in the art should know that the high side driving signal HS and the low side driving signal LS may have the same phase when the high side power switch comprises a P-type MOSFET.

During the dead time T1, the low side driver 302 generates the low side driving signal LS with the middle level, which keeps the low side power switch M2 slightly on, so that most of the current from the ground reference to the output inductor L1 flows through the low side power switch M2 instead of flowing through the body diode D2. Compared to that all the current flowing through the body diode D2 in switching circuit 10 during dead time T1, the current is mostly distributed to the slightly on low side power switch M2. In one embodiment, the body diode D2 may only conduct 10% of the current with the remaining 90% of the current being conducted through the parallel slightly on low side power switch D2. As shown in FIG. 4, charges Qrr stored in the body diode D2 is much less than it would be if all the current flowing through the body diode D2. Thus most of the power loss may be saved.

Figure 5:
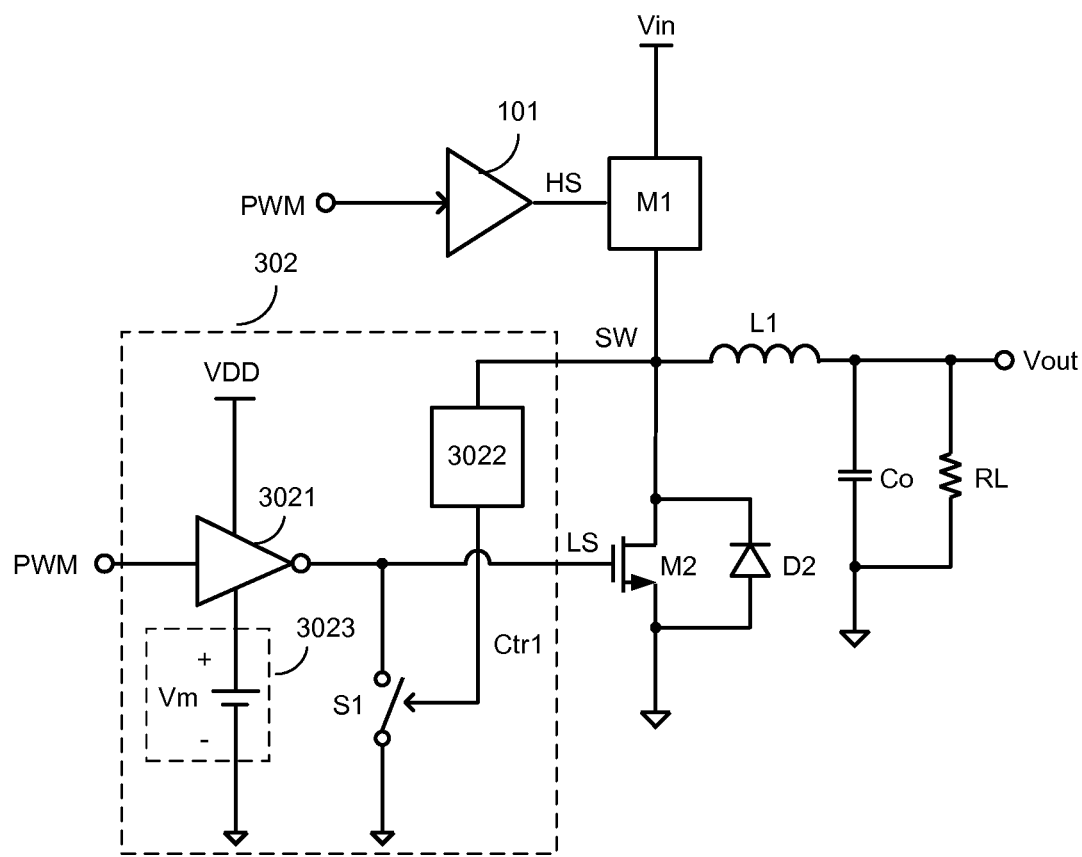
FIG. 5 schematically shows a low side driver 302 in accordance with an embodiment of the present invention.

FIG. 5 schematically shows a low side driver 302 in accordance with an embodiment of the present invention. The low side driver 302 comprises: an inverter 3021 having a power terminal configured to receive the power voltage VDD, a ground terminal coupled to a voltage source 3023 to receive a voltage signal Vm with the middle drive value, an input terminal configured to receive the switching control signal PWM, and an output terminal configured to provide the low side drive signal LS based on the power voltage VDD, the voltage signal Vm with the middle drive value and the switching control signal PWM; a first switch S1 having a first terminal coupled to the output terminal of the inverter 3021, a second terminal coupled to the ground reference, and a control terminal configured to receive a first control signal Ctrl; and a first switch control circuit 3022 having an input terminal configured to receive the switching signal Vsw, and an output terminal configured to provide the first control signal Ctrl based on the switching signal Vsw.

As shown in FIG. 4, before the dead time T1, the switching control signal PWM and the high side drive signal HS are logical low, and the high side power switch M1 is OFF. During this time, the low side drive signal LS is equal to the power voltage VDD, so that the low side power switch M2 is ON. During the dead time T1, the high side drive signal HS is still logical low so that the high side power switch M1 keeps OFF. The low side drive signal LS is equal to the voltage signal Vm with the middle drive value. As a result, the low side power switch Ms is slightly on. After the dead time T1, the high side drive signal HS is logical high and the high side power switch M1 is ON. As a result, the switching signal Vsw at the switching node SW is pulled up to the input voltage Vin. Thus the first control signal Ctrl generated based on the switching signal Vsw turns on the first switch S1 to pull down the low side drive signal LS to the ground reference, and the second power switch M2 is turned off.

Figure 6:
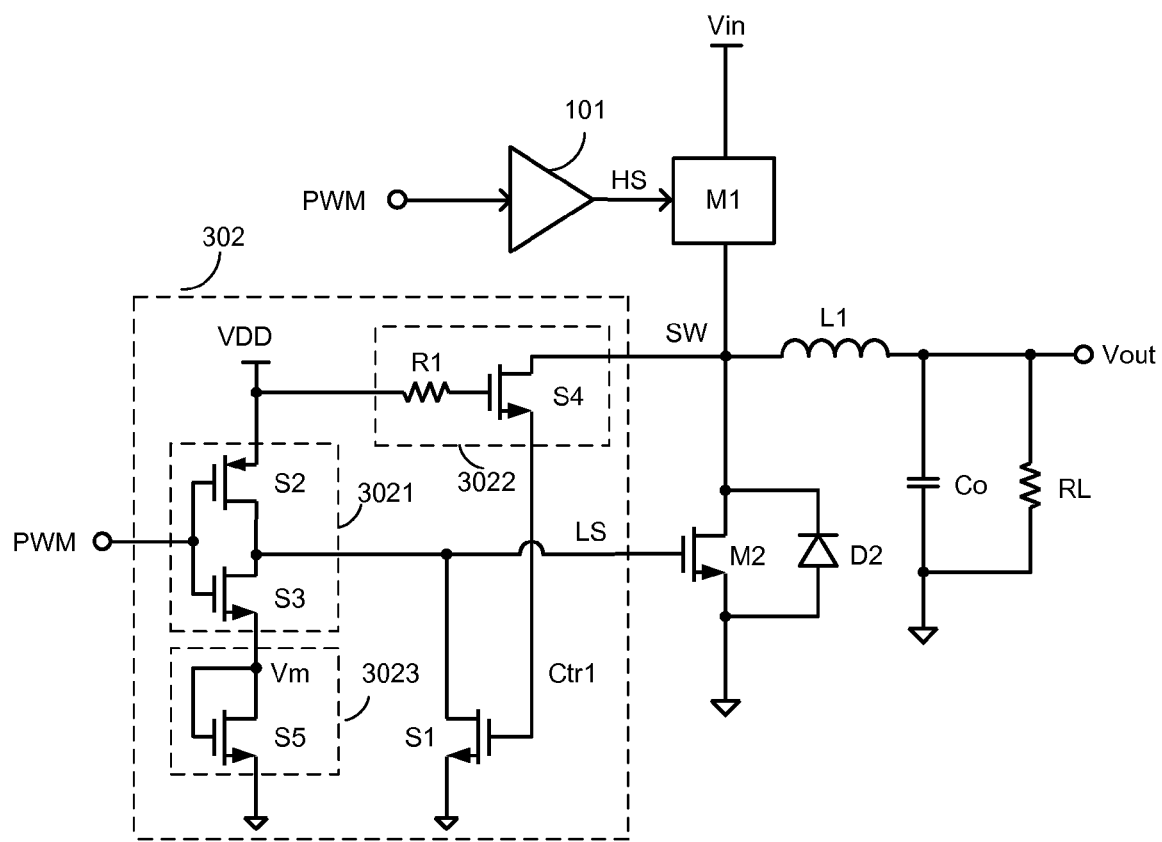
FIG. 6 schematically shows the low side driver 302 in accordance with an embodiment of the present invention.

FIG. 6 schematically shows the low side driver 302 in accordance with an embodiment of the present invention. As shown in FIG. 6, the inverter 3021 comprises: a second switch S2 having a first terminal configured to receive the power voltage VDD, a second terminal coupled to the output terminal of the inverter 3021, and a control terminal configured to receive the switching control signal PWM; and a third switch S3 having a first terminal coupled to the output terminal of the inverter 3021, a second terminal configure to receive the voltage signal Vm with the middle drive value, and a control terminal configured to receive the switching control signal PWM.

In one embodiment, the second switch S2 comprises a P-type MOSFET, and the third switch S3 comprises an N-type MOSFET.

In one embodiment, the first switch control circuit 3022 comprises a fourth switch S4 having a first terminal configured to receive the switching signal Vsw, a second terminal coupled to the control terminal of the first switch S1, and a control terminal configured to receive the power voltage VDD. When the low side power switch M2 is on or slightly on, the switching signal Vsw is almost equal to the ground reference. As a result, a voltage at the second terminal of the fourth switch S4, i.e., the first control signal Ctrl, is almost equal to the ground reference too and the first switch S1 is OFF. When the low side power switch M2 is off, the switching signal Vsw is pulled up to the input voltage Vin. As a result, the voltage at the second terminal of the fourth switch S4, i.e., the first control signal Ctrl, is high enough to turn on the first switch S1. Thus, the low side drive signal LS is pulled down to the ground reference, and the low side power switch M2 is turned off.

In one embodiment, the first switch control circuit 3022 further comprises a first resistor R1 coupled between the power voltage VDD and the control terminal of the fourth switch S4.

In the example of FIG. 6, the voltage source 3023 generating the voltage signal Vm comprises a diode connected N-type MOSFET S5. Persons of ordinary skill in the art should know that any circuit which may generate a voltage signal, like a diode, a diode connected bipolar device and so on, may be used without detracting from the merits of the present invention.

Figure 7:
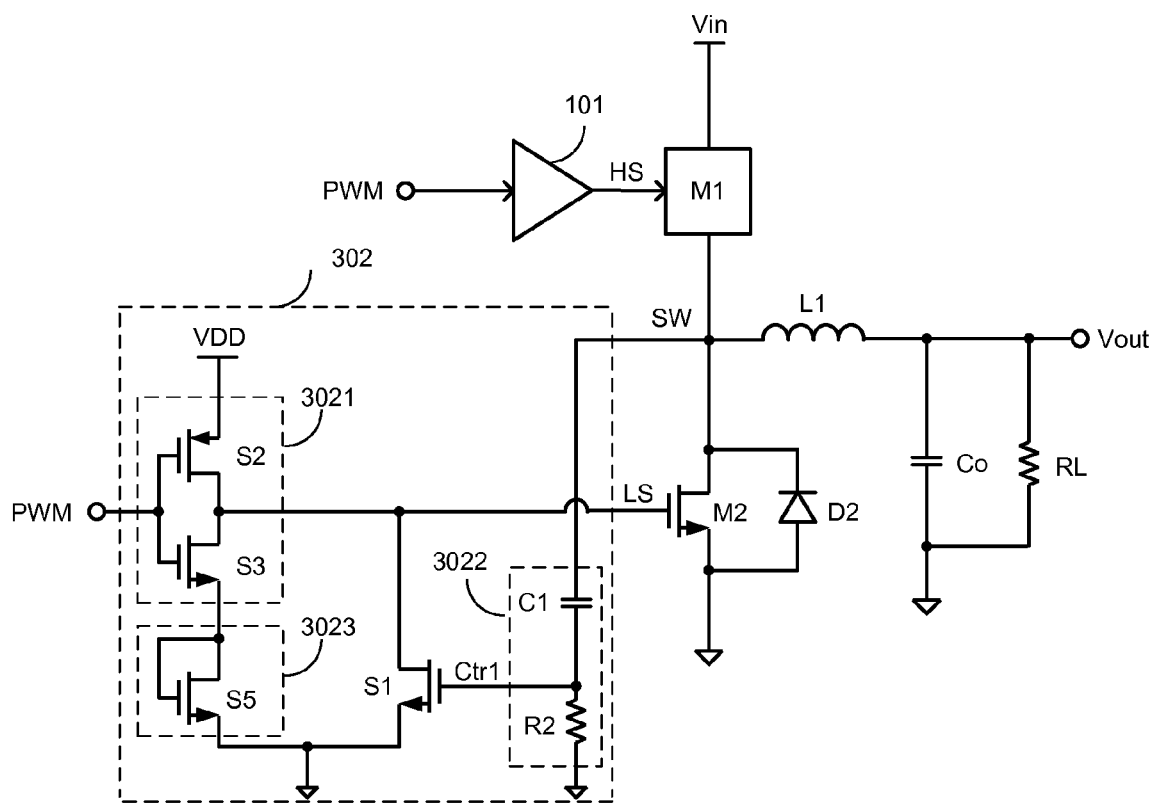
FIG. 7 schematically shows the low side driver 302 in accordance with an embodiment of the present invention.

FIG. 7 schematically shows the low side driver 302 in accordance with an embodiment of the present invention. As shown in FIG. 7, the first switch control circuit 3022 comprises a capacitor C1 having a first terminal configured to receive the switching signal Vsw, and a second terminal coupled to the control terminal of the first switch S1; and a second resistor R2 having a first terminal coupled to the control terminal of the first switch S1, and a second terminal coupled to the ground reference. When the low side power switch M2 is on or slightly on, the switching signal Vsw is almost equal to the ground reference, and the first switch S1 is off. When the low side power switch M2 is off, the switching signal Vsw is pulled up to the input voltage Vin to charge the capacitor C1 and the second resistor R2, so the first control signal Ctrl is high enough to turn on the first switch S1. As a result, the low side drive signal LS is pulled down to the ground reference, and the low side power switch M2 is turned off.

Figure 8:
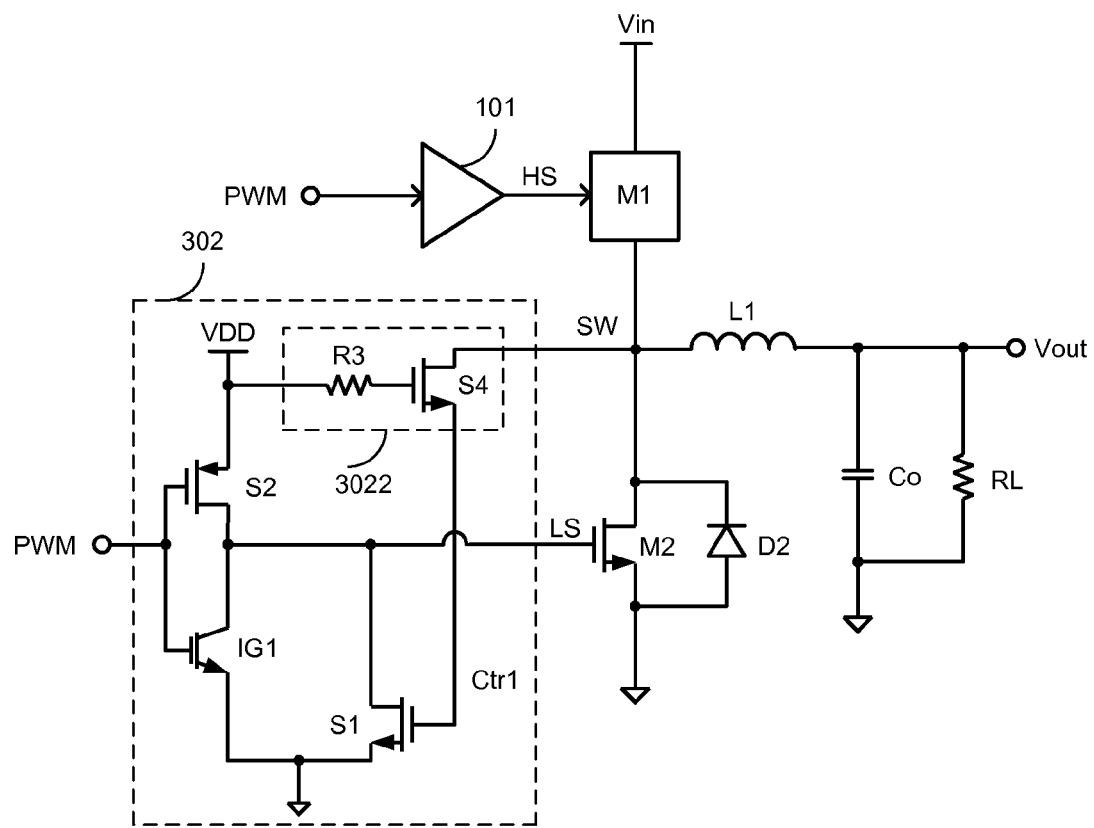
FIG. 8 schematically shows the low side driver 302 in accordance with an embodiment of the present invention.

FIG. 8 schematically shows the low side driver 302 in accordance with an embodiment of the present invention. The low side driver 302 in the example of FIG. 8 comprises: a second switch S2 having a first terminal configured to receive the power voltage VDD, a control terminal configured to receive the switching control signal PWM, and a second terminal coupled to the output terminal of the low side driver 302; an IGBT device IG1 having a first terminal coupled to the second terminal of the second switch S2, a second terminal coupled to the ground reference, and a control terminal configured to receive the switching control signal PWM; a first switch S1 having a first terminal coupled to the output terminal of the low side driver 302, a second terminal coupled to the ground reference, and a control terminal configured to receive a first control signal Ctrl; and a first switch control circuit 3022 having an input terminal configured to receive the switching signal Vsw, and an output terminal configured to provide the first control signal Ctr1 based on the switching signal Vsw.

In the example of FIG. 8, the first switch control circuit 3022 comprises the fourth switch S4 having a first terminal configured to receive the switching signal Vsw, a second terminal coupled to the control terminal of the first switch S1, and a control terminal configured to receive the power voltage VDD. When the low side power switch M2 is on or slightly on, the switching signal Vsw is almost equal to the ground reference. As a result, the voltage at the second terminal of the fourth switch S4, i.e., the first control signal Ctr1, is almost equal to the ground reference too and the first switch S1 is OFF. When the low side power switch M2 is off, the switching signal Vsw is pulled up to the input voltage Vin. As a result, the voltage at the second terminal of the fourth switch S4, i.e., the first control signal Ctr1, is high enough to turn on the first switch S1. Thus, the low side drive signal LS is pulled down to the ground reference, and the low side power switch M2 is turned off.

In one embodiment, the first switch control circuit 3022 further comprises the first resistor R1 coupled between the power voltage VDD and the control terminal of the fourth switch S4.

As shown in FIG. 4, before the dead time T1, the switching control signal PWM and the high side drive signal HS are logical low, and the high side power switch M1 is off. During this time, the low side drive signal LS is equal to the power voltage VDD, so the low side power switch M2 is on. During the dead time T1, the high side drive signal HS is still logical low so that the high side power switch M1 keeps off. The IGBT device IG1 is turned on by the switching control signal PWM, and the low side drive signal LS has a middle drive value equal to the on voltage of the IGBT device IG1 to slightly turn on the low side power switch Ms. After the dead time T1, the high side drive signal HS is logical high and the high side power switch M1 is turned ON. As a result, the switching signal Vsw at the switching node SW is pulled up to the input voltage Vin. Thus the first control signal Ctr1 generated based on the switching signal Vsw turns on the first switch S1 to pull down the low side drive signal LS to the ground reference, and the second power switch M2 is turned off.

Figure 9:
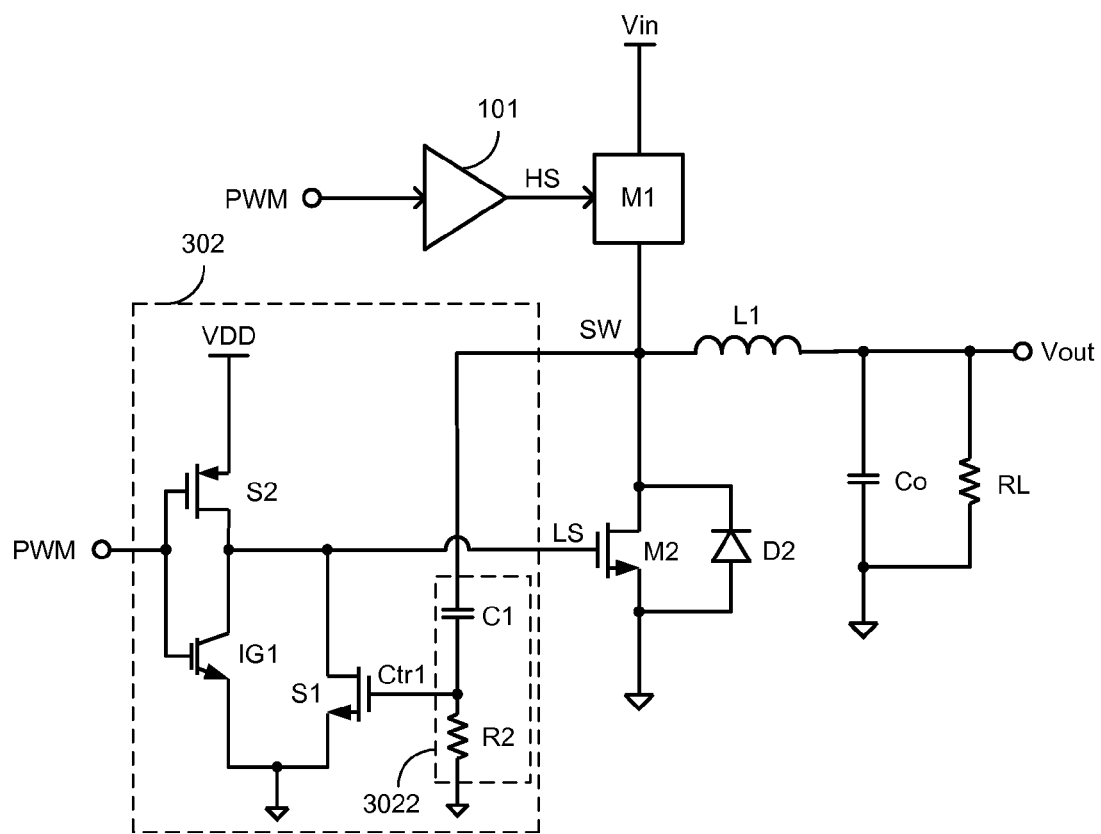
FIG. 9 schematically shows the low side driver 302 in accordance with an embodiment of the present invention.

FIG. 9 schematically shows the low side driver 302 in accordance with an embodiment of the present invention. In the example of FIG. 9, the first switch control circuit 3022 comprises: the capacitor C1 having a first terminal configured to receive the switching signal Vsw, and a second terminal coupled to the control terminal of the first switch S1; and the second resistor R2 having a first terminal coupled to the control terminal of the first switch S1, and a second terminal coupled to the ground reference. When the low side power switch M2 is on or slightly on, the switching signal Vsw is almost equal to the ground reference, and the first switch S1 is off. When the low side power switch M2 is off, the switching signal Vsw is pulled up to the input voltage Vin to charge the capacitor C1 and the second resistor R2, so that the first control signal Ctr1 is high enough to turn on the first switch S1. As a result, the low side drive signal LS is pulled down to the ground reference, and the low side power switch M2 is turned off.

Figure 10:
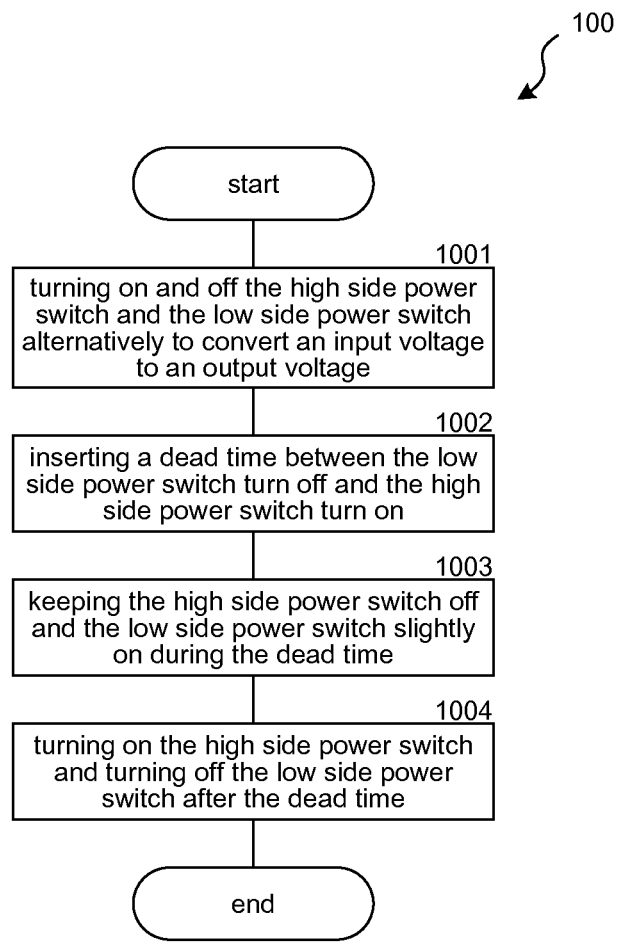
FIG. 10 shows a method 100 for driving a switching circuit in accordance with an embodiment of the present invention.

FIG. 10 shows a method 100 for driving a switching circuit in accordance with an embodiment of the present invention. The switching circuit may comprise a high side power switch and a low side power switch with a body diode. The method 100 comprises: step 1001, turning on and off the high side power switch and the low side power switch alternatively to convert an input voltage to an output voltage; step 1002, inserting a dead time between the low side power switch turn off and the high side power switch turn on; step 1003, keeping the high side power switch off and the low side power switch slightly on during the dead time; and step 1004, turning on the high side power switch and turning off the low side power switch after the dead time.

Several embodiments of the foregoing switching circuits comprise a low side driver providing a three-level low side driving signal, thus having less power consumption compared to switching circuits with conventional low side driver. A current flowing through the body diode during the dead time between the low side power switch turn off and the high side power switch turn on is mostly distributed to the slightly on low side power switch according to the embodiments of the present invention, so that the charges stored in the body diode are reduced and the so caused power loss is decreased.

This written description uses examples to disclose the invention, including the best mode, and also to enable a person skilled in the art to make and use the invention. The patentable scope of the invention may include other examples that occur to those skilled in the art.

I claim:

1. A switching circuit, comprising:
a high side power switch having a first terminal coupled to an input voltage of the switching circuit, a second terminal coupled to a switching node, and a control terminal configured to receive a high side driving signal;
a low side power switch having a first terminal coupled to the switching node, a second terminal coupled to a reference ground, and a control terminal configured to receive a low side driving signal; and
a low side driver having a first input terminal coupled to the switching node to receive a switching signal, a second input terminal configured to receive a switching control signal, and an output terminal configured to provide the low side driving signal based on the switching signal and the switching control signal;
wherein the high side power switch and the low side power switch are turned on and off alternatively, and the low side driving signal has a middle drive value between a power voltage of the low side driver and the reference ground during a dead time between the low side power switch turn off and the high side power switch turn on, to slightly turn on the low side power switch, so as to distribute part of a current flowing through a body diode of the low side power switch;
wherein the low side driver comprises:
an inverter having a power terminal configured to receive the power voltage, a ground terminal coupled to a voltage source to receive a voltage signal with the middle drive value, an input terminal configured to receive the switching control signal, and an output terminal configured to provide a low side drive signal based on the power voltage, the voltage signal with the middle drive value and the switching control signal;
a first switch having a first terminal coupled to the output terminal of the inverter, a second terminal coupled to the ground reference, and a control terminal configured to receive a first control signal; and
a first switch control circuit having an input terminal configured to receive the switching signal, and an output terminal configured to provide the first control signal based on the switching signal.

2. The switching circuit of claim 1, further comprising a high side driver having an input terminal coupled to the switching control signal and an output terminal configured to provide the high side driving signal based on the switching control signal.

3. The switching circuit of claim 1, wherein the inverter comprises:
   a second switch having a first terminal configured to receive the power voltage, a second terminal coupled to the output terminal of the inverter, and a control terminal configured to receive the switching control signal; and
   a third switch having a first terminal coupled to the output terminal of the inverter, a second terminal configure to receive the voltage signal with the middle drive value, and a control terminal configured to receive the switching control signal.

4. The switching circuit of claim 1, wherein the first switch control circuit comprises a fourth switch having a first terminal configured to receive the switching control signal, a second terminal coupled to the control terminal of the first switch, and a control terminal configured to receive the power voltage.

5. The switching circuit of claim 4, wherein the first switch control circuit further comprises a first resistor coupled between the power voltage and the control terminal of the fourth switch.

6. The switching circuit of claim 1, wherein the first switch control circuit comprises:
   a capacitor having a first terminal configured to receive the switching signal, and a second terminal coupled to the control terminal of the first switch; and
   a second resistor having a first terminal coupled to the control terminal of the first switch, and a second terminal coupled to the ground reference.

7. The switching circuit of claim 1, wherein the voltage source comprises a diode, a diode connected MOSFET or a diode connected bipolar device.

* * * * *